United States Patent
Sekine

(10) Patent No.: US 8,835,768 B2
(45) Date of Patent: Sep. 16, 2014

(54) FLEXIBLE CIRCUIT BOARD

(75) Inventor: Noriaki Sekine, Tokyo (JP)

(73) Assignee: Yamaichi Electronics Co. Ltd., Tokyo (JP)

( * ) Notice: Subject to any disclaimer, the term of this patent is extended or adjusted under 35 U.S.C. 154(b) by 109 days.

(21) Appl. No.: 13/234,551

(22) Filed: Sep. 16, 2011

(65) Prior Publication Data

US 2012/0132458 A1 May 31, 2012

(30) Foreign Application Priority Data

Nov. 30, 2010 (JP) ................................. 2010-266989

(51) Int. Cl.
*H05K 1/03* (2006.01)
*H05K 1/02* (2006.01)
*H05K 1/11* (2006.01)
*H05K 3/40* (2006.01)
*H05K 3/46* (2006.01)

(52) U.S. Cl.
CPC ............ *H05K 1/0393* (2013.01); *H05K 1/0219* (2013.01); *H05K 2201/0715* (2013.01); *H05K 1/118* (2013.01); *H05K 3/4069* (2013.01); *H05K 3/4614* (2013.01); *H05K 2201/0133* (2013.01); *H05K 2201/0141* (2013.01); *H05K 3/4652* (2013.01); *H05K 3/4626* (2013.01); *H05K 1/0218* (2013.01); *H05K 3/4688* (2013.01)
USPC .......................................... 174/255; 174/262

(58) Field of Classification Search
None
See application file for complete search history.

(56) References Cited

U.S. PATENT DOCUMENTS

| 6,495,764 | B1 | 12/2002 | Hori | |
|---|---|---|---|---|
| 6,565,954 | B2 * | 5/2003 | Andou et al. | ................. 428/209 |
| 7,173,322 | B2 | 2/2007 | Sakata et al. | |
| 7,790,268 | B2 | 9/2010 | Kennedy et al. | |
| 8,624,121 | B2 | 1/2014 | Niki | |
| 2004/0004823 | A1 | 1/2004 | Sakata et al. | |
| 2004/0231151 | A1 * | 11/2004 | Nakatani et al. | ................. 29/830 |
| 2005/0150686 | A1 * | 7/2005 | Powell | ........................... 174/262 |
| 2005/0181541 | A1 | 8/2005 | Sakata et al. | |
| 2006/0041068 | A1 | 2/2006 | Ohno et al. | |
| 2007/0263370 | A1 * | 11/2007 | Niki | .............................. 361/783 |
| 2008/0217050 | A1 * | 9/2008 | Egitto et al. | .................. 174/262 |
| 2008/0251947 | A1 | 10/2008 | Sakata et al. | |

(Continued)

FOREIGN PATENT DOCUMENTS

| CN | 1241894 A | 1/2000 |
|---|---|---|
| CN | 1444270 A | 9/2003 |

(Continued)

OTHER PUBLICATIONS

High Temperature Polymers for Microelectronics, CMC Publishing Co., Ltd., High Technology Information, May 30, 2003, p. 192.

(Continued)

*Primary Examiner* — Ishwarbhai B Patel
(74) *Attorney, Agent, or Firm* — Banner & Witcoff, Ltd.

(57) ABSTRACT

In a flexible circuit board, signal wirings and ground wirings are provided on one main surface of a base film formed of a thermoset resin. A coverlay film formed of a thermoplastic resin is adhered to and integrated with the signal wirings, ground wirings, and base film. External terminals 15 are disposed in a predetermined conductor pattern on one main surface of the coverlay film, and a plated layer is formed on each of the external terminals. A first ground layer and a rear side resin film are adhered in this order below the base film to be integrated.

6 Claims, 6 Drawing Sheets

(56) References Cited

U.S. PATENT DOCUMENTS

| | | |
|---|---|---|
| 2008/0254313 A1 | 10/2008 | Kennedy et al. |
| 2009/0035591 A1* | 2/2009 | Nishikawa et al. ............ 428/458 |
| 2011/0000700 A1 | 1/2011 | Sato et al. |
| 2011/0220399 A1 | 9/2011 | Niki |

FOREIGN PATENT DOCUMENTS

| | | |
|---|---|---|
| CN | 101124861 A | 2/2008 |
| CN | 101529662 A | 9/2009 |
| CN | 101683005 A | 3/2010 |
| JP | H03-187288 B2 | 8/1991 |
| JP | 2001-135974 | 5/2001 |
| JP | 2002-261453 A | 9/2002 |
| JP | 2004-103652 A | 4/2004 |
| JP | 2006-083364 A | 3/2006 |
| JP | 2008-103640 A | 5/2008 |
| JP | 2009-212098 A | 9/2009 |
| JP | 2009-302343 | 12/2009 |

OTHER PUBLICATIONS

Office Action Issued in Chinese Patent Application No. 20111031788.8, mailed on Nov. 29, 2013.
"High Temperature Polymers for Microelectronics", CMC Publishing Co., Ltd., High Technology Information, May 30, 2003, p. 192.
Seminar Held by Gijutu Joho Kyokai, Jun. 30, 2005.
Office Action Issued in Chinese Patent Application No. 20111031788.8, mailed Nov. 29, 2013.
Office Action Issued in Japanese Patent Application No. 2010-266989, mailed Dec. 24, 2013.
Notification informing Submission of publication in Japanese Patent Application No. 2010-266989, mailed Oct. 29, 2013.

* cited by examiner

FLEXIBLE CIRCUIT BOARD

CROSS-REFERENCE TO RELATED APPLICATIONS

The application claims the benefits of Japanese Patent Application No. 2010-266989 filed Nov. 30, 2010 which is hereby incorporated by reference herein its entirely.

BACKGROUND OF THE INVENTION

1. Field of the Invention

The present invention relates to a flexible circuit board on which a transmission wiring, a circuit wiring, and the like are arranged and, more particularly, to a flexible circuit board using a dielectric layer formed of a thermoplastic resin between the wirings, having excellent high-frequency signal transmission characteristics, and facilitating achievement of a multilayer configuration.

2. Description of the Related Art

A flexible circuit board used for an electronic device such as a network device, a server, and a tester, or for cable connection is required to transmit a high-speed digital signal having a band of several GHz to several tens of GHz without losing high-frequency characteristics. Further, in a mobile electronic device like a portable device, high-density wiring and short, small, light, and thin design is now proceeding under a design trend of short, small, light, and thin of such an electronic device. Under such circumstances, miniaturization of a conductor pattern serving as a transmission wiring or circuit wiring and reduction in the space between the conductor patterns are proceeding, and further, implementation of a multilayer structure of the conductor pattern is now underway.

A liquid crystal polymer which is a thermoplastic resin is disclosed as a preferred example of a dielectric layer to be formed between the conductor patterns in a flexible circuit board (refer to, e.g., Jpn. Pat. Appln. Laid-Open Publication No. 2001-135974). This thermoplastic liquid crystal polymer is low in its dielectric constant and dielectric tangent and extremely low in water and moisture absorbency. Therefore, excellent transmission characteristics of a high-frequency signal in the flexible circuit board, that is, excellent transmission/conduction characteristics based on stably low reactance, impedance, and transmission loss can be obtained.

However, in the case where two or more flexible circuit boards are multilayered by laminating interlayer dielectric layers formed of the thermoplastic liquid crystal polymer and applying heating and pressurization (hereinafter, referred to also as "hot press") to the resultant structure, a position gap of the conductor patterns or a conductive member connecting the conductor patterns easily occurs and, at the same time, the positioning accuracy in the laminated structure is deteriorated to easily cause a failure in electrical connection between layers, which makes miniaturization of the conductor pattern and the like difficult.

Generally, in the multilayering process of the wiring board conducted by the hot press, the thermoplastic resin serving as the interlayer dielectric layer is soften, which makes it very difficult to adopt a lamination method of laying up a plurality of layers on a layer-to-layer basis. Further, even in a method of laminating a required number of thermoplastic resin films each on which the conductor pattern and the like are formed and integrated by one hot press process (refer to, e.g., Jpn. Pat. Appln. Laid-Open Publication No. 2009-302343), the position gap of the conductor pattern in the connection portion due to softening or melting of the laminated thermoplastic resin films inevitably occurs. Thus, high-level technical management and high-performance manufacturing facility are essential for the manufacturing process.

As described above, in the multilayering process of the flexible circuit board achieved by laminating a plurality of thermoplastic resin films by the hot press, high-level production management and quality management are required to make it difficult to achieve a reduction in the manufacturing cost, resulting in difficulty in cost reduction of the flexible circuit board.

The present invention has been made to solve the above problems, and an object thereof is to provide a flexible circuit board having an interlayer dielectric layer formed of a thermoplastic resin and excellent in high-frequency signal transmission characteristics, and facilitating achievement of a multilayer configuration. Another object of the present invention is to provide a flexible circuit board capable of simplifying a manufacturing method of a high-performance flexible circuit board and reducing the cost thereof.

SUMMARY OF THE INVENTION

To achieve the above object, according to an aspect of the present invention, there is provided a flexible circuit board including: a first insulating layer formed of a thermoplastic resin having a conductive layer on its one main surface; and a second insulating layer formed of a thermoset resin having a conductive layer on its one main surface and adhered to and integrated with the first insulating layer. The curing temperature of the thermoset resin is lower than the glass-transition point or melting point of the thermoplastic resin, and the elastic modulus of the second insulating layer formed of the thermoset resin is lower than the elastic modulus of the first insulating layer formed of the thermoplastic resin.

BRIEF DESCRIPTION OF THE DRAWINGS

FIGS. 3A to 3C are views illustrating the flexible circuit board according to the first embodiment of the present invention, in which FIG. 3A is a cross-sectional view taken in the X direction of FIG. 1, FIG. 3B is a cross-sectional view taken along Y direction of FIG. 1, and FIG. 3C is a cross-sectional view taken along Z direction of FIG. 2;

DESCRIPTION OF THE EMBODIMENTS

Embodiments of the present invention will be described with reference to the accompanying drawings. The drawings are schematic, and it should be noted that proportions between dimensions and the like are not actual.

First Embodiment

Figure 1:
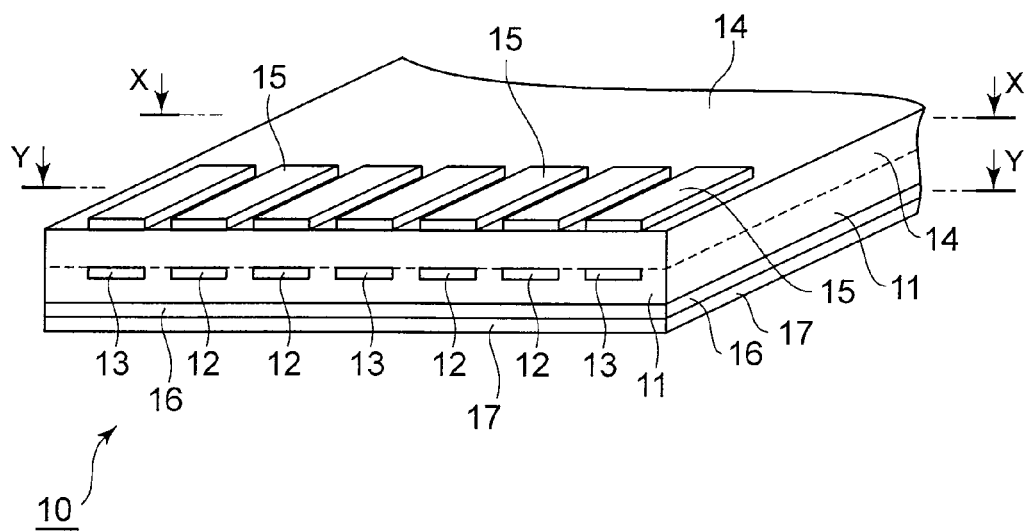
FIG. 1 is a partially enlarged perspective view illustrating an example of a flexible circuit board according to a first embodiment of the present invention.

A flexible wiring board according to a first embodiment of the present invention will be described with reference to FIGS. 1 to 4. In this embodiment, two examples of a flexible circuit board each on which a high-frequency signal transmission wiring is formed will be described. As shown in FIG. 1 and FIGS. 3A and 3B, in a flexible circuit board 10 of one example, a plurality of strip lines including signal wirings 12 and ground wirings 13 are provided, in the form of a layered conductor pattern, on one main surface of a base film 11 of a thermoset resin. The signal wirings 12 are each a two-pair transmission wiring compatible with LVDS (Low Voltage Differential Signaling). This flexible circuit board can be used as a flat cable.

The flexible circuit board has a coverlay film 14 formed of a thermoplastic resin. The coverlay film 14 is laminated so as to be adhered to and integrated with the signal wirings 12, ground wirings 13, and base film 11. External terminals 15 for surface mounting of, e.g., a semiconductor element are disposed in a predetermined conductor pattern on one main surface of the coverlay film 14 laminated on the base film 11.

A first ground layer 16 and a rear side resin film 17 are adhered in this order below the base film 11 to be integrated. Further, as illustrated in FIG. 3B, the signal wirings 12 and ground wirings 13 are connected to their corresponding external terminals 15 through a cone-shaped first conductive bumps 18 each serving as a conductive member. The ground wirings 13 are electrically connected to the first ground layer 16 through second conductive bumps 19 each serving as a conductive member. The ground wirings 13 and the first ground layer 16 each act as an electromagnetic shield to reduce electromagnetic interference between the signal wirings 12 or signal disturbance caused by external electromagnetic wave.

Figure 2:
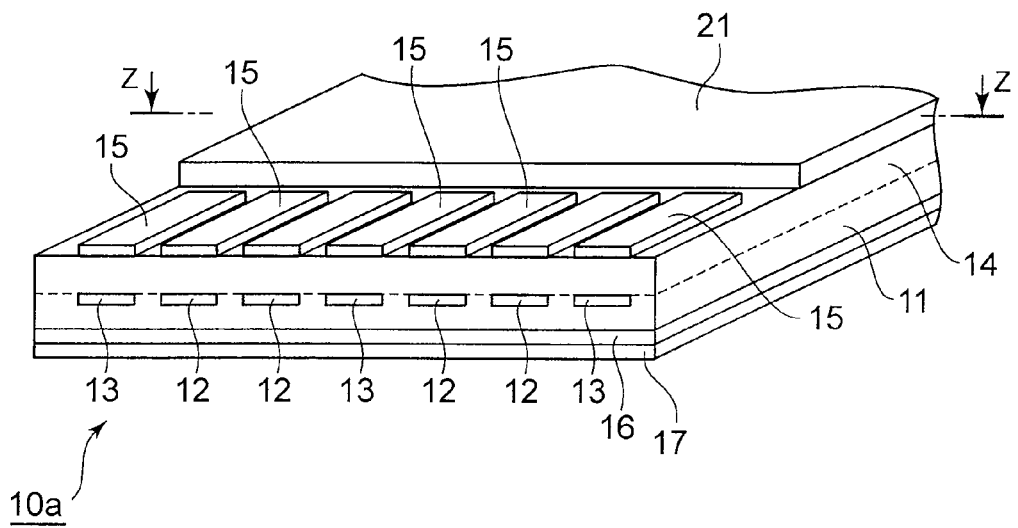
FIG. 2 is a partially enlarged perspective view illustrating another example of the flexible circuit board according to the first embodiment of the present invention.
Figure 3A:
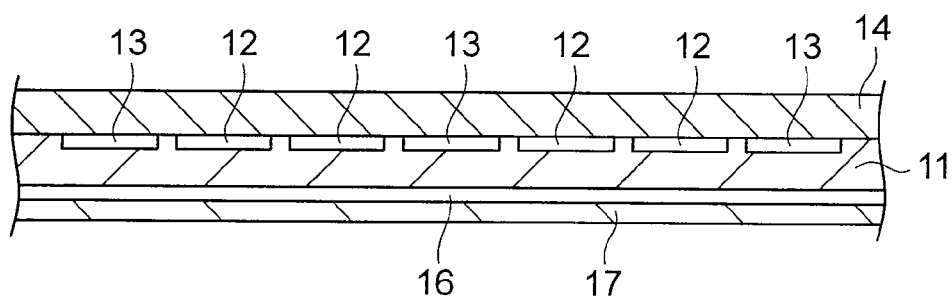
Figure 3B:
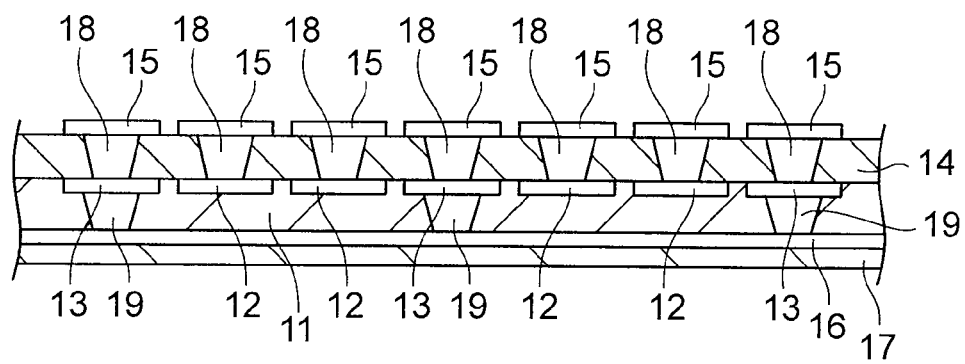
Figure 3C:
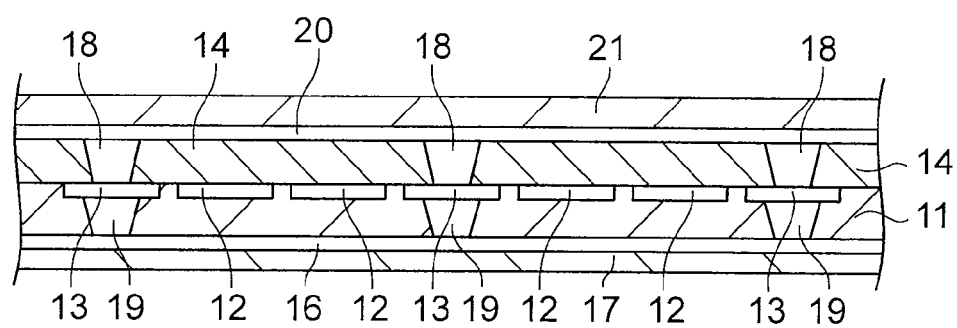

As illustrated in FIG. 2 and FIG. 3C, in the case of a flexible circuit board 10a of another example, a second ground layer 20 and a front side resin film 21 are sticked to be laminated in a predetermined area on the one main surface of the coverlay film 14. The ground wirings 13 are connected to the second ground layer 20 through a large number of first conductive bumps 18 provided along the arrangement direction of each ground wiring 13. Further, the ground wirings 13 are also connected to the first ground layer 16 through a large number of second conductive bumps 19 provided along the arrangement direction of each ground wiring 13. By laminating the front side resin film 21 in this manner, in the flexible wiring board 10a, higher electromagnetic shielding performance than in the flexible circuit board 10 can be obtained.

In the abovementioned flexible circuit boards 10 and 10a, examples of the thermoplastic resin suitably used for the coverlay film 14 include a liquid crystal polymer, a thermoplastic polyimide resin, and a composite resin thereof. The liquid crystal polymer is particularly preferable because of its excellent high-frequency transmission characteristics and flexibility. The liquid crystal polymer is multi-axially oriented thermoplastic polymer typified by, e.g., XYDAR (product name of Dartco Co.,) and VECTRA (product name of Clanese Co.,). Other insulating resin may be added or compounded to the liquid crystal polymer to be denatured. For example, Vecstar FA type (melting point: 285° C., product name of Kuraray co.), Vecstar CT-X type (melting point: 280° C. to 335° C.), BIAC film (melting point: 335° C.) or the like can be cited.

Examples of the thermoplastic resin further include a polyethylene terephthalate (PET) resin, a polyether ether ketone (PEEK) resin, and a polyphenylene sulfide (PPS) resin.

In the above flexible circuit boards 10 and 10a, a thermoset resin used for the base film 11 satisfies a condition that the thermal curing temperature thereof is lower than a glass-transition point Tg or melting point Tm of the abovementioned thermoplastic resin. The thermal curing temperature of the thermoset resin is the temperature at which the uncured resin film is cured by polymerization or cross-linking. Some thermoplastic resin has the glass-transition point Tg and some does not exhibit a distinct glass-transition point Tg and, in the case of the thermoplastic resin that does not exhibit a distinct glass-transition point Tg, the thermal curing temperature is set lower than the melting point Tm of the thermoplastic resin.

The glass-transition point is generally obtained using a TMA method and a DMA method as a glass transition temperature measurement method (conforming to JIS C6493). In the TMA method, the temperature of a test piece is raised at a rate of 10° C./minute from a room temperature, a thermal analyzer is used to measure the thermal expansion amount of the test piece in the thickness direction, tangent lines are drawn to a curve around the glass-transition point, and the Tg is calculated from the intersection of the tangent lines. In the DMA method (pull method), the temperature of a test piece is raised at a rate of 2° C./minute from a room temperature, a viscoelasticity measuring instrument is used to measure the dynamic viscoelasticity and loss tangent of the test piece, and the Tg is calculated from the peak temperature of the loss tangent. In the present invention, the DMA method is used.

Further, the thermoset resin used for the base film 11 satisfies a condition that the elastic modulus of the film is lower than the elastic modulus of the film of the abovementioned thermoplastic resin. As the elastic modulus, pulling elastic modulus or bending elastic modulus is used. In the present invention, the elastic modulus is measured according to JIS K 7127 or ASTM D 882.

The elastic modulus of the above thermoset resin film can be adjusted adequately by mixing an elastomer with the thermoset resin. Preferable examples of such an elastomer component include a resin having a low dielectric tangent, such as a polyester resin, a nitrile rubber (NBR), and a styrene-butadiene rubber (SBR). For example, the pulling elastic modulus of the thermoset resin film is set in a range of 100 MPa to 1 GPa. The pulling elastic modulus of a typical thermoplastic resin film is in a range from about 2 GPa to 10 GPa; however, by adjusting the pulling elastic modulus of the thermosetting resin film to the above value, the obtained flexible circuit board exhibits sufficient bending performance and flexibility.

As the above thermoset resin, a resin that satisfies the above condition is selected from, e.g., an epoxy resin, a polyester resin, a thermoset polyimide resin, and a composite resin thereof. Although various combinations of the thermoplastic resin and thermoset resin are available, it is preferable that a condition is satisfied in which the dielectric constant or dielectric tangent in the film state of the thermoset resin is not higher than the dielectric constant in the film state of the thermoplastic resin. By doing this, it is possible to ensure extremely excellent transmission characteristics of a high-frequency signal in the flexible circuit boards 10 and 10a. Further, it is preferable that a condition is satisfied in which the thermal expansion coefficient in the film state of the thermoset resin becomes close to the thermal expansion coefficient of the above thermoplastic resin. In this manner, surface strain, such as warpage, of the flexible circuit board composed of a laminated body of the thermoset resin and thermoplastic resin can be suppressed.

In considering a combination of the thermoplastic resin and thermoset resin, when a liquid crystal polymer is selected as the thermoplastic resin, it is preferable to use a resin composed of oligophenylene ether and styrene-butadiene elastomer as the thermoset resin. This combination satisfies the above all conditions. For example, ADFLEMA OPE (product name of Namics Co.,) can be cited.

In the case of the above combination, the dielectric constants of the base film 11 and the coverlay film 14 are 3 or less, and the electrostatic tangents of them are 0.003 or less. Thus, the signal wirings 12 in the flexible wiring boards 10 and 10a exhibit extremely excellent transmission/conduction characteristics of a high-speed digital signal of a band of several GHz to several tens of GHz. Further, appropriate bending performance and flexibility of the flexible circuit board can be obtained.

The first conductive bump 18 and the second conductive bump 19 are each formed of a metal material such as silver (Ag), copper (Cu), gold (Au), and solder. The conductor pattern such as the signal wiring, ground wiring, and ground layer is formed of normal Cu. As the conductive bump, one in which metal powders are bonded together with a resin binder so as to allow screen printing to be performed may be used.

A single layer of, e.g., Au, Ag, nickel (Ni) or a composite layer of Ni/Au or Ni/Ag is plated on the metal material surface (e.g., Cu material surface) of the external terminal 15.

Various thermoplastic resins or various thermoset resins can be used for the rear side resin film 17 and front side resin film 21. Further, for example, a resin like a polyimide film "Kapton" (product name of Du Pont-Toray Co.,) can be used.

Figure 4A:
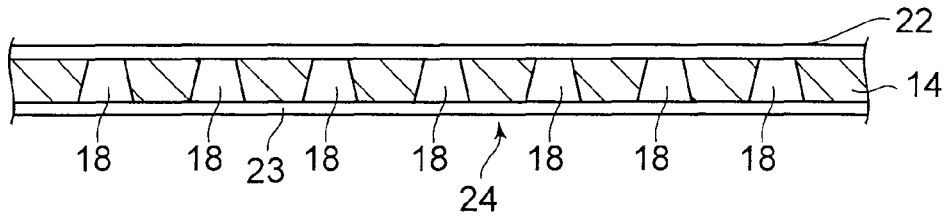
FIGS. 4A to 4E are manufacturing process cross-sectional views illustrating an example of a manufacturing method of the flexible circuit board according to the first embodiment of the present invention.

Next, an example of a manufacturing method of the flexible circuit board 10 will be described. FIGS. 4A to 4E are manufacturing process cross-sectional views taken in the Y-direction of FIG. 1. As illustrated in FIG. 4A, a double-sided copper foil clad laminate 24 obtained by cladding a first metal foil 22 and a second metal foil 23 to the front and rear surfaces of the coverlay film 14 formed of a liquid crystal polymer having a thickness of about 15 μm to 50 μm is prepared. The thicknesses of the first and second metal foils 22 and 23 are about 10 μm to 20 μm. The first conductive bumps 18 electrically connected to the first and second metal foils 22 and 23 are formed at predetermined positions of the metal foils. The first conductive bumps 18 are each formed by a method in which a known metal foil with a bump and a resin film are laminated for hot press so as to embed a bump in the resin film.

Figure 4B:
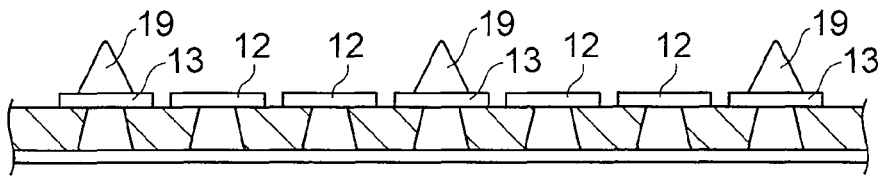

Then, as illustrated in FIG. 4B, the first metal foil 22 is patterned into a conductor pattern as a strip line by a known etching technique so as to form the signal wirings 12 and ground wirings 13. After that, the conductive bumps 19 each having, e.g., a cone-shape are formed on the ground wirings 13 by screen printing.

Figure 4C:
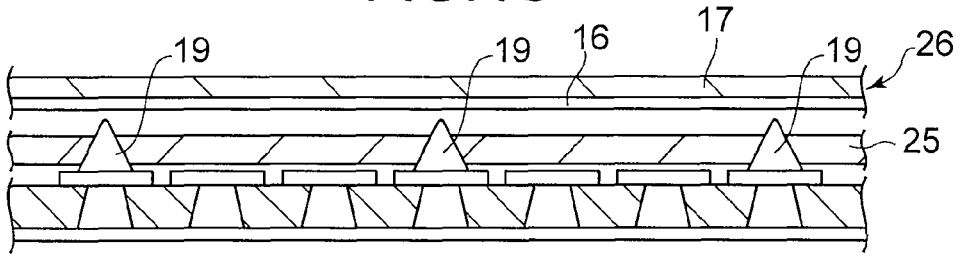
Figure 4D:
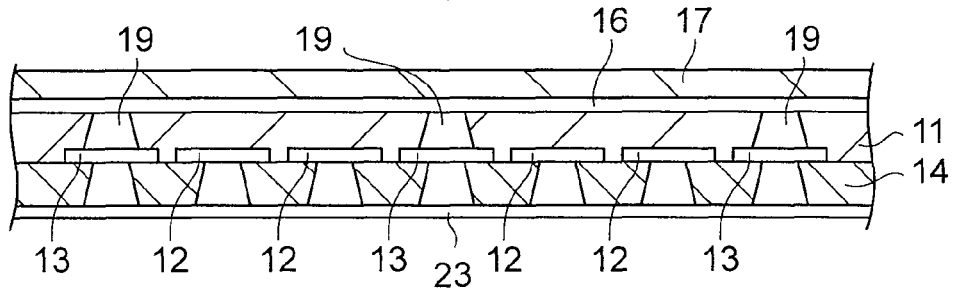

Then, as illustrated in FIG. 4C, an uncured thermosetting resin film 25 having a thickness of about 35 μm to 100 μm, the first ground layer 16, and a one-sided copper foil clad laminate 26 formed of the rear side resin film 17 having a thickness of about 15 μm to 25 μm are laminated from above, followed by hot press to form the base film 11 in which the second conductive bumps 19 connected to the first ground layer 16 are embedded as illustrated in FIG. 4D. The head portion of each cone-shaped conductive bump 19 is crushed flatly to be plastically deformed. The base film 11 is thermocompression bonded to the signal wirings 12, the ground wirings 13, and the coverlay film 14 to be adhered and integrated with them.

In the hot press process, atmosphere gas is in, e.g., a decompressed state, and the heating temperature at that time is a temperature at which the uncured thermosetting resin film 25 is thermally cured. This temperature is lower than the glass-transition point or melting point of the coverlay film 14 formed of the thermoplastic resin and is set to, e.g., about 180° C. to 230° C. The pressurization is carried out at, e.g., 10 kgf/cm$^2$ to 40 kgf/cm$^2$. Thus, hot press can be carried out with a small force, so that the flexible circuit board 10 is less subject to warpage.

Figure 4E:
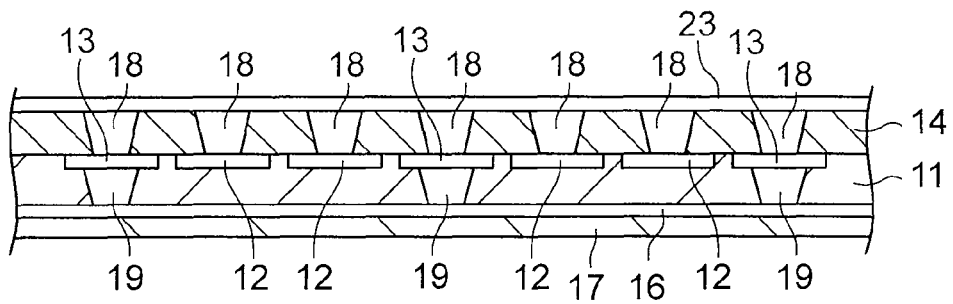

In FIG. 4E illustrating a state where the front and rear surfaces illustrated in FIG. 4D are turned upside down, the second metal foil 23 are patterned into a conductor pattern to form the external terminals 15. Further, a plated layer (not illustrated) is formed on each of the external terminals 15. In this manner, the flexible wring board 10 having the cross-section illustrated in FIG. 3B is obtained.

In the manufacturing process of the flexible circuit board 10, a large standard size structure is obtained by the lamination and integration, followed by cutting into predetermined shapes whereby a plurality of the flexible circuit boards 10 are obtained. Preferably, the formation of plated layer on the surface of each external terminal 15 is performed in a state before cutting the large standard size structure with the conductor-patterned signal wirings 12 and ground wirings 13 used as power feeding layers.

In the manufacturing process of the flexible circuit board 10, the one-sided copper foil clad laminate 26 may be one obtained by cladding a metal foil or applying electrolytic plating to the surface of a resin film.

A manufacturing process of the flexible wiring plate 10a is substantially the same as that of the flexible circuit board 10. In this case, when the second metal foil 23 is patterned into a conductor pattern, the second ground layer 20 is formed together with the external terminals 15. Then, the front side resin film 21 having a thickness of 15 μm to 25 μm and coating the second ground layer 20 is adhered to the thermoplastic resin sheet or thermoset resin sheet by, e.g., a thermal roll laminating method.

In the flexible circuit boards 10 and 10a according to the present embodiment, the coverlay film 14 (first insulating layer) formed of the thermoplastic resin is adhered to and integrated with the base film 11 (second insulating layer) formed of the thermoset resin. In this connecting process, the base film 11 is thermocompression bonded to the coverlay film 14 and the like at a curing temperature lower than the glass-transition point or melting point of the coverlay film 14. Therefore, in the multilayering of the flexible circuit board according to the present embodiment, softening or thermal flow of the coverlay film 14 caused by hot press is suppressed. This prevents occurrence of position gap in the signal wirings 12 and ground wirings 13 which are formed into a conductor pattern on the main surface of the coverlay film 14 and the first and second conductive bumps 18 and 19 which are conductive members. In this manner, the multilayering of the flexible circuit board having the interlayer dielectric layer formed of the thermoplastic resin can be facilitated.

Further, in the connecting process between the base film 11 and the coverlay film 14 having the conductor pattern and conductive members, it is not necessary to provide an adhesive layer that may cause the dielectric tangent to increase by using adhesive. Thus, a reduction in the dielectric constants of the base film 11 and coverlay film 14 and a reduction in the dielectric tangents of them can be achieved easily. As a result, speed-up of a high-frequency signal and reduction in the dielectric loss can be easily achieved in the flexible circuit board, whereby a high-performance flexible circuit board having excellent transmission characteristics can be obtained.

Further, in the flexible circuit boards 10 and 10a according to the present embodiment, no adhesive is required in their lamination and integration processes, thereby simplifying the manufacturing process of the flexible circuit board. As described above, even in the high-performance flexible circuit board, increase in productivity can be attained easily, resulting in a reduction in the manufacturing cost and cost of the flexible circuit board itself.

Second Embodiment

A flexible circuit board according to a second embodiment will be described with reference to FIG. 5 illustrating an example of a manufacturing process thereof. In the second embodiment, a flexible circuit board provided with two-layer circuit wirings will be described.

Figure 5A:
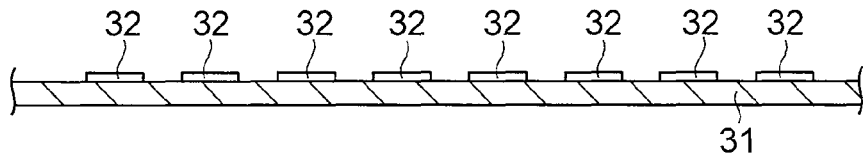
FIGS. 5A to 5F are manufacturing process cross-sectional views illustrating an example of a manufacturing method of the flexible circuit board according to a second embodiment of the present invention.

A one-sided copper foil clad laminate having a metal foil cladded on one main surface of a thermoplastic resin film like a liquid crystal polymer having a thickness of about 25 μm to 50 μm is prepared. Then, as illustrated in FIG. 5A, the metal foil is selectively etched to form a conductor pattern, whereby a first circuit pattern 32 is formed on one main surface of a first insulating layer 31 formed of a thermoplastic resin film.

Figure 5B:
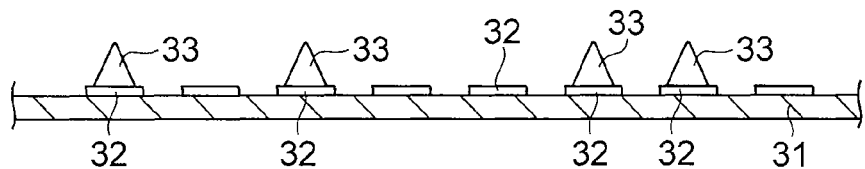
Figure 5C:
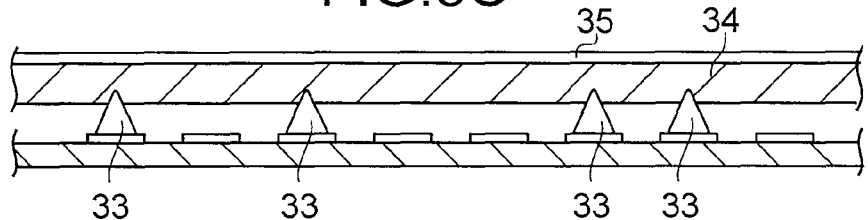
Figure 5D:
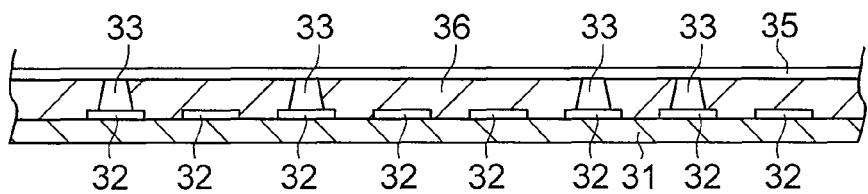

Subsequently, as illustrated in FIG. 5B, conductive bumps 33 are formed on predetermined positions of the first circuit pattern 32 as in the first embodiment. Then, as illustrated in FIG. 5C, an uncured thermosetting resin film 34 and a metal foil 35 are laminated from above, followed by hot press. Then, as illustrated in FIG. 5D, the head portions of the conductive bumps 33 are crushed flatly to be plastically deformed, whereby a second insulating layer 36 in which the conductive bumps 33 connected to the metal foil 35 are embedded is formed. The second insulating layer 36 is formed of a thermally cured resin film obtained as a result of thermal curing applied to the uncured thermosetting resin film 34 and is thermocompression bonded and adhered to the first insulating layer 31 and the first circuit pattern 32. As described in the first embodiment, in the hot press, the heating temperature at that time is a temperature at which the uncured thermosetting resin film 34 is thermally cured and is set lower than the glass-transition point or melting point of the first insulating layer 31.

Figure 5E:
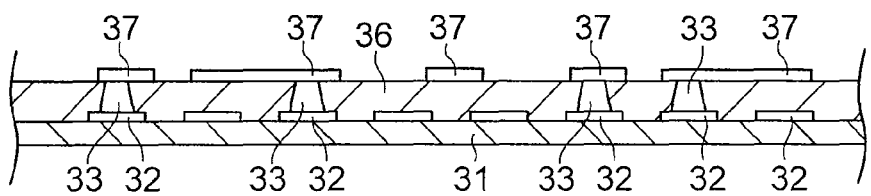
Figure 5F:
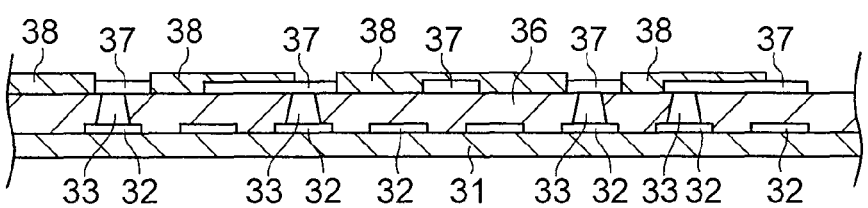

Subsequently, as illustrated in FIG. 5E, the metal foil 35 is patterned into a conductor pattern so as to form a second circuit pattern 37. Then, as illustrated in FIG. 5F, a solder resist 38 exposing predetermined areas of the second circuit pattern 37 is formed.

In the manner as described above, a flexible circuit board having a printed circuit in which the first insulating layer 31 of the thermoplastic resin film and the first circuit pattern 32, the second insulating layer 36 of the thermosetting resin film and the second circuit pattern 37 are adhered to be integrated is obtained.

The thermoplastic resin and thermoset resin used in the present embodiment are selected from among those described in the first embodiment. Also in the present embodiment, it is preferable to use a combination of a liquid crystal polymer selected as the thermoplastic resin and a resin composed of oligophenylene ether and styrene-butadiene elastomer selected as the thermoset resin.

The second embodiment can provide the same effects as those of the first embodiment, and there can be provided a flexible circuit board having a wiring circuit compatible with high frequency (up to GHz) of, e.g., a computer CPU clock.

Third Embodiment

Figure 6A:
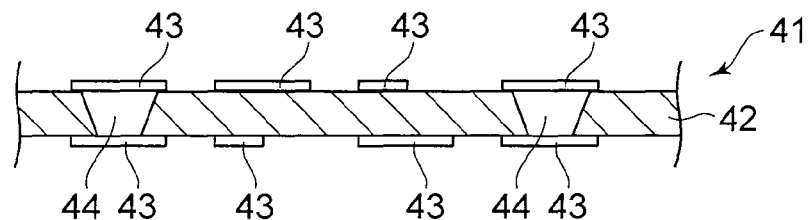
FIGS. 6A to 6D are manufacturing process cross-sectional views illustrating an example of a manufacturing method of the flexible circuit board according to a third embodiment of the present invention.
Figure 6B:
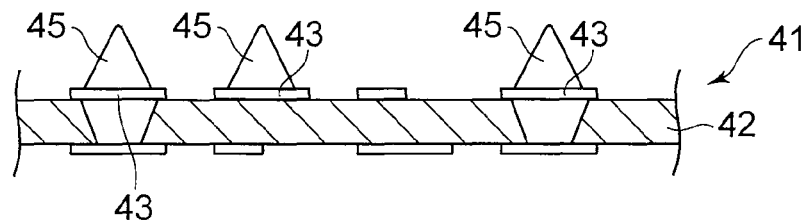
Figure 6C:
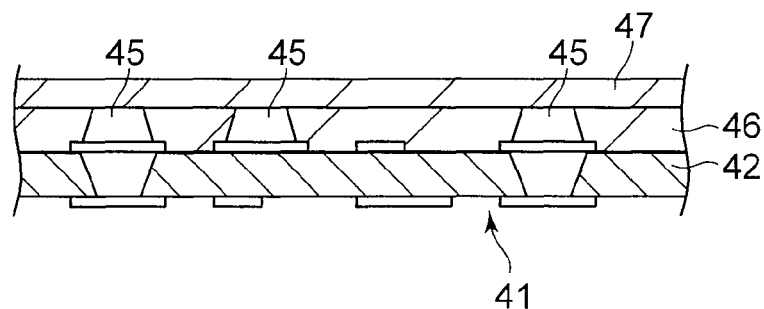
Figure 6D:
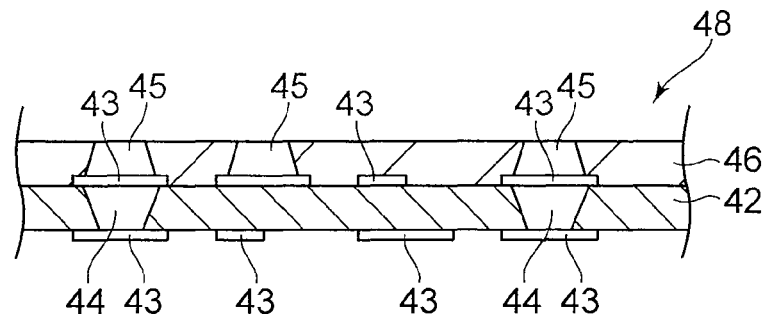
Figure 7:
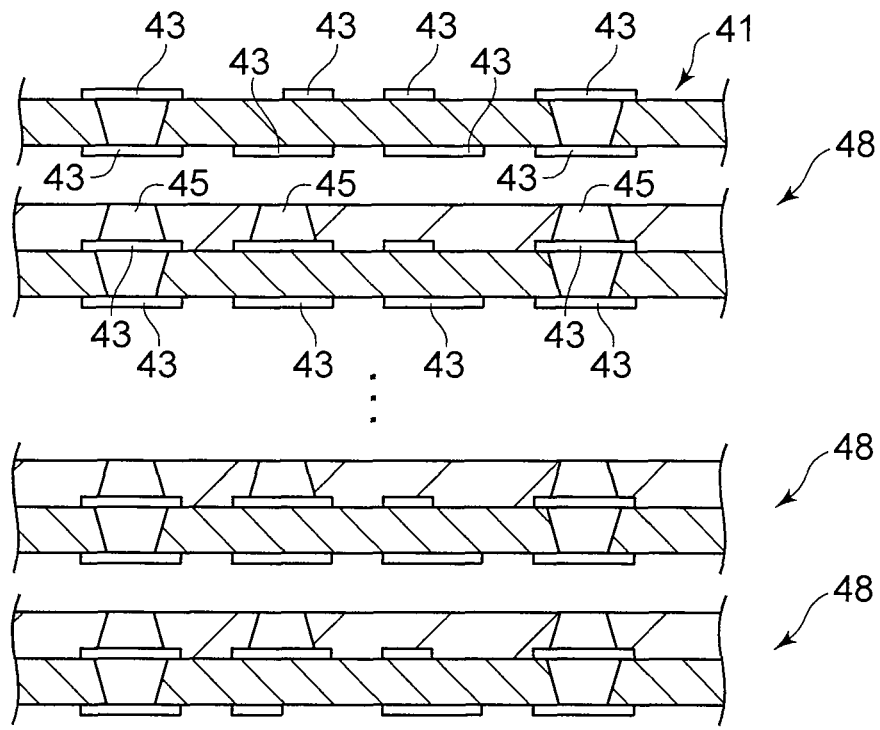
FIGS. 7A and 7B are manufacturing process cross-sectional views continued from the processes of FIG. 6.

Next, a flexible circuit board according to a third embodiment will be described with reference to FIGS. 6 and 7 illustrating an example of a manufacturing process thereof. In the third embodiment, a flexible circuit board provided with three or more-layer circuit wirings will be described.

For example, metal foils cladded on the both sides of a double-sided copper foil clad laminate as exemplified in the first embodiment are patterned into conductor patterns to prepare a double-sided circuit board 41 as illustrated in FIG. 6A. In the double-sided circuit board 41, circuit patterns 43 are formed on both sides of a thermoplastic resin film 42 formed of a liquid crystal polymer. The front-side circuit pattern 43 and rear-side circuit pattern 43 are connected to each other at predetermined positions by first conductive bumps 44. The thermoplastic resin film 42 serves as a first dielectric layer.

Subsequently, as illustrated in FIG. 6B, cone-shaped second conductive bumps 45 are formed on the front-side circuit pattern 43 by screen printing in the same manner as that of the first embodiment. Then, as illustrated in FIG. 6C, an uncured thermosetting resin film 46 and a sheet-like supporting member 47 made of a resin or the like are laminated from above onto and integrated with the double-sided circuit board 41 having the second conductive bumps 45 by hot process. The heating temperature in the hot press is a temperature at which the uncured thermosetting resin film 46 is thermally cured and is set lower than the glass-transition point or melting point of the thermoplastic resin film 42. The pressurization is carried out at, e.g., 10 kgf/cm$^2$ to 40 kgf/cm$^2$. Thus, hot press can be carried out with a small force, so that the flexible circuit board 10 is less subject to warpage.

Then, as illustrated in FIG. 6D, the sheet-like supporting member 47 is peeled off to form a stacked circuit board 48. In this stacked circuit board 48, the thermoplastic resin film 42 and thermosetting resin film 46 are thermocompression bonded to each other, and circuit patterns 43 using the thermoplastic resin film 42 and thermosetting resin film 46 as their interlayer dielectric layers are formed. Further, the two-layer circuit patterns 43 are appropriately connected to each other by the first conductive bumps 44, and the second conductive bumps 43 are provided at predetermined positions of the circuit pattern 43. The thermosetting resin film 46 thermocompression bonded to the thermoplastic resin film 42 serves as a second insulating layer.

The thermoplastic resin serving as the thermoplastic resin film 42 and thermoset resin serving as the thermosetting resin film 46 used in the present embodiment are selected appropriately from among those described in the first embodiment. Also in the third embodiment, it is preferable to use a combination of a liquid crystal polymer selected as the thermoplastic resin and a resin composed of oligophenylene ether and styrene-butadiene elastomer selected as the thermoset resin.

A flexible circuit board having a required number of wiring layers is manufactured by a build-up method using the above-mentioned double-sided circuit board 41 and stacked circuit board 48. For example, as illustrated in FIG. 7A, one double-sided circuit board 41 and a required number of the stacked circuit boards 48 are set up. In this set-up process, the above circuit boards are set to a predetermined position followed by lamination. In this case, positions of the double-sided circuit board 41 or stacked circuit board 48 needs to be adjusted such that the circuit pattern 43 is connected to the second conductive bumps 45. The circuit pattern 43 of the double-sided circuit board 41 may be formed into a required pattern different from the pattern illustrated in FIG. 6A. Similarly, in the plurality of stacked circuit boards 48, each of the circuit patterns 43 may be formed into a required pattern.

Figure 7B:
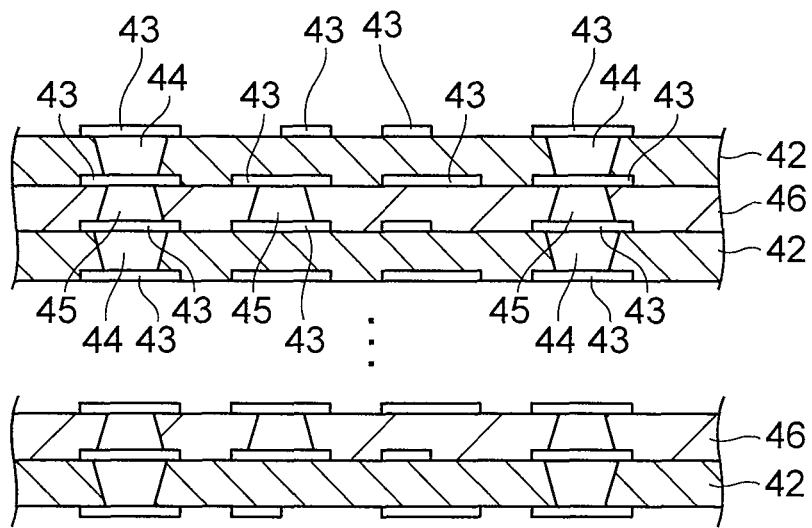

Multilayer lamination press is applied to the setup double-sided circuit board 41 and stacked circuit boards 48 by hot press of a predetermined temperature/pressure. In this manner, a multilayered flexible printed circuit board as illustrated in FIG. 7B is obtained. The heating temperature in the hot press is a temperature at which the thermoplastic resin film 42 is soften to be thermocompression bonded to the thermosetting resin film 46. The pressurization is carried out at, e.g., 10 kgf/cm$^2$ to 70 kgf/cm$^2$. Thus, hot press can be carried out with a small force, so that the flexible circuit board 10 is less subject to warpage. In this hot press, the thermosetting resin film 46 is cured by polymerization or cross-linking, so that the plastic deformation due to heating does not occur.

In addition to the above method, there are available various manufacturing method of the flexible circuit board having a multilayer printed circuit. For example, in place of the thermal roll laminating method of the thermosetting resin film 46 illustrated in FIG. 6C, a one-sided copper foil clad laminate having a metal foil cladded on one main surface of the uncured thermosetting resin film 46 is prepared. Subsequently, hot press is applied with the uncured thermosetting resin film 46 facing down so as to thermocompression bond the uncured thermosetting resin film 46 to the double-sided circuit board 41 in the state of FIG. 6B for lamination and integration. The hot press in this case is performed under the same condition as that described in the first embodiment. Then, the metal foil is patterned into a conductor pattern. Thus, resulting from one-layer build-up, a flexible circuit board having three-layer circuit patterns is obtained.

Further, the uncured thermosetting resin film 46 and a metal foil having conductive bumps at its predetermined areas are hot pressed onto the double-sided circuit board 41 in which build-up of one layer has been completed from below for lamination and integration. In this manner, a flexible circuit board having a printed circuit with a four-layer circuit patterns is obtained.

The third embodiment can provide the same effects as those of the first embodiment. Further, in a three-layer or more multilayer structure of the flexible circuit board, occurrence of the position gap in the circuit pattern and conductive bumps can be easily suppressed. This allows the positioning accuracy in the lamination of a plurality of resin films to be improved to easily achieve miniaturization of the circuit pattern and the like. In this manner, a high-performance flexible circuit board in which the high-density wiring and short, small, light, and thin design have been achieved is simplified in its manufacturing process, eliminating the need for high-level technical management and high-performance manufacturing facility. As a result, a cost reduction of the high-performance flexible circuit board can be achieved.

Although preferred embodiments of the present invention have thus been described, the present invention is by no means limited to the embodiments described above. Various modifications and changes may be made in a concrete embodiment by those skilled in the art without departing from the technical concept and technical scope of the invention.

As a substitute for the conductive bump as described in the above embodiments, a plated via formed between circuit layers used in a multilayer lay-up process may be used.

What is claimed is:
1. A flexible circuit board comprising:
a first insulating layer formed of a thermoplastic resin having a conductive layer on its one main surface; and
a second insulating layer formed of a thermoset resin having a conductive layer on its one main surface and adhered to and integrated with the first insulating layer,
wherein the curing temperature of the thermoset resin is lower than the glass-transition point or melting point of the thermoplastic resin, and
wherein the elastic modulus of the second insulating layer formed of the thermoset resin is set in a range of 100 MPa to 1 GPa such that the elastic modulus of the second insulating layer is lower than the elastic modulus of the first insulating layer formed of the thermoplastic resin.
2. The flexible circuit board according to claim 1, wherein the thermoplastic resin is a liquid crystal polymer, and the thermoset resin is a resin obtained by mixing oligophenylene ether and styrene-butadiene elastomer.
3. The flexible circuit board according to claim 1, wherein the first and second insulating layers are alternately laminated to form a multilayer structure.
4. The flexible circuit board according to claim 2, wherein the first and second insulating layers are alternately laminated to form a multilayer structure.
5. The flexible circuit board according to claim 1, wherein the conductive layer formed on the one main surface of the second insulating layer includes a signal circuit pattern and a ground circuit pattern,
the second insulating layer further has a first ground layer to be adhered to the other main surface thereof, and
the first ground layer is electrically connected to the ground circuit pattern through the second insulating layer.
6. The flexible circuit board according to claim 5, wherein the first insulating layer has a second ground layer to be adhered to the one main surface thereof, and
the second ground layer is electrically connected to the ground circuit pattern of the second insulating layer through the first insulating layer.

\* \* \* \* \*